United States Patent
Chen et al.

(10) Patent No.: US 6,403,241 B1
(45) Date of Patent: Jun. 11, 2002

(54) COCRPTB MEDIUM WITH A 1010 CRYSTALLOGRAPHIC ORIENTATION

(75) Inventors: Qixu (David) Chen, Milpitas; Samuel Dacke Harkness, IV, San Francisco; Zhong (Stella) Wu, Fremont; Lin Huang; Rajiv Yadav Ranjan, both of San Jose; Charles Leu, Fremont, all of CA (US)

(73) Assignee: Seagate Technology, Inc., Scotts Valley, CA (US)

( * ) Notice: Subject to any disclaimer, the term of this patent is extended or adjusted under 35 U.S.C. 154(b) by 0 days.

(21) Appl. No.: 09/496,342

(22) Filed: Feb. 2, 2000

Related U.S. Application Data

(60) Provisional application No. 60/129,306, filed on Apr. 14, 1999.

(51) Int. Cl.$^7$ .............................. G11B 5/66; G11B 5/70; B05D 5/12
(52) U.S. Cl. ............................ 428/694 TS; 428/336; 427/131; 427/132
(58) Field of Search .................... 428/694 TS, 900, 428/336; 427/131, 132

(56) References Cited

U.S. PATENT DOCUMENTS

| | | | |
|---|---|---|---|
| 5,693,426 A | | 12/1997 | Lee et al. ................... 428/611 |
| 6,117,570 A | * | 9/2000 | Chen et al. ............... 428/694 T |
| 6,139,951 A | * | 10/2000 | Chen et al. .................. 428/332 |
| 6,143,388 A | * | 11/2000 | Bian et al. .................. 428/65.3 |
| 6,156,404 A | * | 12/2000 | Ross et al. .................. 428/65.3 |
| 6,183,860 B1 | * | 2/2001 | Cheng et al. ............... 428/336 |

OTHER PUBLICATIONS

Lee, Li–Lien, et al., IEEE Transactions on Magnetics (1994), 30(6):3951–3953.
Lee, Li–Lien, et al., IEEE Transactions on Magnetics (1995), 31(6):2728–2730.
Lee, Li–Lien, et al., J. Appl. Phys. (1996), 79(8):4902–4904.
Laughlin, David E., et al., IEEE Transactions on Magnetics (1996), 32(5):3632–3637.

* cited by examiner

Primary Examiner—Paul Thibodeau
Assistant Examiner—Holly C. Rickmon
(74) Attorney, Agent, or Firm—Morrison & Foerster LLP

(57) ABSTRACT

A magnetic recording medium on glass or Al substrates with film structure of NiAl seed layer/CrMo underlayer/CoCrPtB magnetic layer/carbon overcoat, in which the magnetic layer has a substantially (10.0) crystallographic orientation, exhibits high coercivity, high signal-to-medium noise ratio and low transition jitter. The medium can be used for high-density longitudinal magnetic recording. Embodiments include forming a surface oxidized NiAl sub-seed layer on a glass or glass-ceramic substrate, and sequentially depositing a seed layer of NiAl, an underlayer of Cr or Cr-alloy, such as CrMo, and a CoCrPtB magnetic layer.

15 Claims, 5 Drawing Sheets

COCRPTB MEDIUM WITH A 1010 CRYSTALLOGRAPHIC ORIENTATION

RELATED APPLICATIONS

This application claims priority from Provisional Application Ser. No. 60/129,306 filed Apr. 14, 1999, entitled "CoCrPtB MEDIUM WITH A 1010 CRYSTALLOGRAPHIC ORIENTATION," the entire disclosure of which is hereby incorporated herein by reference.

FIELD OF INVENTION

This invention relates to magnetic recording media, such as thin film magnetic recording disks, and to a method of manufacturing the media. The invention has particular applicability to high areal density magnetic recording media exhibiting low noise, and high coercivity.

BACKGROUND

The increasing demands for higher areal recording density impose increasingly greater demands on thin film magnetic recording media in terms of remanent coercivity (Hr), magnetic remanance (Mr), coercivity squareness (S*), medium noise, i.e., signal-to-medium noise ratio (SMNR), and narrow track recording performance. It is extremely difficult to produce a magnetic recording medium satisfying such demanding requirements.

The linear recording density can be increased by increasing the Hr of the magnetic recording medium, and by decreasing the medium noise, as by maintaining very fine magnetically non-coupled grains. Medium noise in thin films is a dominant factor restricting increased recording density of high-density magnetic hard disk drives, and is attributed primarily to inhomogeneous grain size and inter-granular exchange coupling. Accordingly, in order to increase linear density, medium noise must be minimized by suitable microstructure control.

It is recognized that the magnetic properties, such as Hr, Mr, S* and SMNR, which are critical to the performance of a magnetic alloy film, depend primarily upon the microstructure of the magnetic layer which, in turn, is influenced by the underlying layers, such as the underlayer. It is also recognized that underlayers having a fine grain structure are highly desirable, particular for growing fine grains of hex-agonal close packed (HCP) Co-alloys deposited thereon.

It has been reported that nickel-aluminum (NiAl) films exhibit a grain size that is smaller than similarly deposited Cr films, which are the underlayer of choice in conventional magnetic recording media. Li-Lien Lee et al., "NiAl Underlayers For CoCrTa Magnetic Thin Films," IEEE Transactions an Magnetics, Vol. 30, No. 6, pp. 3951–3953, 1994. Accordingly, NiAl thin films are potential candidates as underlayers for magnetic recording media for high-density longitudinal magnetic recording. However, it was found that the coercivity of a magnetic recording medium comprising an NiAl underlayer is too low for high density recording, e.g., about 2,000 Oersted (Oe) The use of an NiAl underlayer is also disclosed by C. A. Ross et al., "The Role Of An NiAl Underlayers In Longitudinal Thin Film Media," J. Appl. Phys. 81(a), P.4369, 1997.

In order to increase Hr, magnetic alloys containing platinum (Pt), such as Co—Cr—Pt-tantalum (Ta) alloys have been employed. Although Pt enhances film Hr, it was found that Pt also increases media noise. Accordingly, it has become increasingly difficult to achieve high areal recording density while simultaneously achieving high SMNR and high Hr.

In copending U.S. patent application Ser. No. 09/152,326 filed on Sep. 14, 1998, now U.S. Pat. No. 6,117,570 a magnetic recording medium is disclosed comprising a surface oxidized seed layer, e.g., an oxidized NiAl layer, and sequentially deposited thereon a Cr-containing underlayer, a CoCrTa intermediate layer and a CoCrPtTa magnetic layer.

Doerner's U.S. Pat. No. 5,523,173, entitled "Magnetic recording medium with a CoPtCrB alloy thin film with a 1120 crystallographic orientation deposited on an underlayer with 100 orientation," demonstrated that (11.0) textured CoCrPtB medium has lower noise than CoCrPt medium on Cr-alloy underlayer.

Lee's U.S. Pat. No. 5,693,426, entitled "Magnetic recording medium with B2 structured underlayer and a cobalt-based magnetic layer," discloses CoCrPtB as an alloy for a magnetic layer. Also, Lee discloses that a $(10.0)_{Co}$ peak was observed in a CoCrPt/NiAl film, in which the NiAl layer was the underlayer and the CoCrPt layer was the magnetic layer. However, Lee does not disclose a (10.0) crystallographic orientation in a B and Co containing magnetic layer.

There exists a need for high areal density magnetic recording media exhibiting high Hr and high SMNR. There also exists a need for magnetic recording media containing a glass or glass ceramic substrate exhibiting high Hr, and high SMNR.

SUMMARY OF THE INVENTION

An advantage of this invention is a magnetic recording medium for high areal recording density exhibiting low noise and high Hr.

Another advantage of this invention is a method of manufacturing a magnetic recording medium suitable for high areal recording density and exhibiting low noise and high Hr.

According to one embodiment of this invention, a magnetic recording medium comprises a substrate means for supporting a magnetic recording film and a magnetic recording means for recording data, the magnetic recording means comprising B, Cr and Co, and wherein the magnetic recording means is located on the substrate means and has a substantially (10.0) crystallographic orientation. The substrate means includes any substrate such as a glass, glass-ceramic, NiP/aluminum, metal alloys, plastic/polymer material, ceramic, glass-polymer, composite materials or other non-magnetic materials. The magnetic recording means is a material capable of being magnetized, typically in the form of a magnetic layer.

Additional advantages and features of this invention will be set forth in part in the description that follows and in part will become apparent to those having ordinary skill in the art upon examination of the following description and from the knowledge gained by practicing the invention. The advantages of this invention may be realized and obtained and are particularly pointed out in the claims.

According to this invention, the foregoing and other advantages are achieved by a magnetic recording medium comprising a substrate; an underlayer on the substrate; and a magnetic layer comprising B, Cr and Co. The magnetic layer has a substantially (10.0) crystallographic orientation, which gave certain advantages over a recording medium having a (11.0) crystallographic orientation. This is especially true for glass and glass-ceramic substrates.

Another aspect of this invention is a method of manufacturing a magnetic recording medium, comprising depositing a seed layer on a substrate; depositing an underlayer on the seed layer; and depositing a magnetic layer on the underlayer. The magnetic layer comprises B, Cr and Co and it has a substantially (10.0) crystallographic orientation.

Additional advantages of this invention will become readily apparent to those skilled in this art from the following detailed description, wherein only the preferred embodiments of this invention is shown and described, simply by way of illustration of the best mode contemplated for carrying out this invention. As will be realized, this invention is capable of other and different embodiments, and its details are capable of modifications in various obvious respects, all without departing from this invention. Accordingly, the drawings and description are to be regarded as illustrative in nature and not as restrictive.

DETAILED DESCRIPTION

This invention provides magnetic recording media suitable for high areal recording density exhibiting high Hr, and high SMNR. This invention achieves such technological advantages by using a B, Cr and Co containing magnetic layer having a substantially (10.0) crystallographic orientation and strategically reducing the size of the grains of the underlayer and magnetic layer and increasing the uniformity of the grains of the underlayer and magnetic layer.

In accordance with embodiments of this invention, a NiAl layer is deposited on a substrate, such as a glass or glass-ceramic substrate. The surface of the NiAl layer is optionally oxidized to form a sub-seed layer of $NiAlO_x$ and a NiAl seed layer deposited on the $NiAlO_x$ sub-seed layer. Subsequently, a CrMo underlayer is deposited on the NiAl seed layer. Then, a CoCrPtB magnetic layer having a substantially (10.0) crystallographic orientation is deposited on the CrMo underlayer. Another embodiment of this invention includes depositing a thin intermediate magnetic layer of CoCrTa on the underlayer and depositing the magnetic layer on the intermediate layer.

Figure 1:
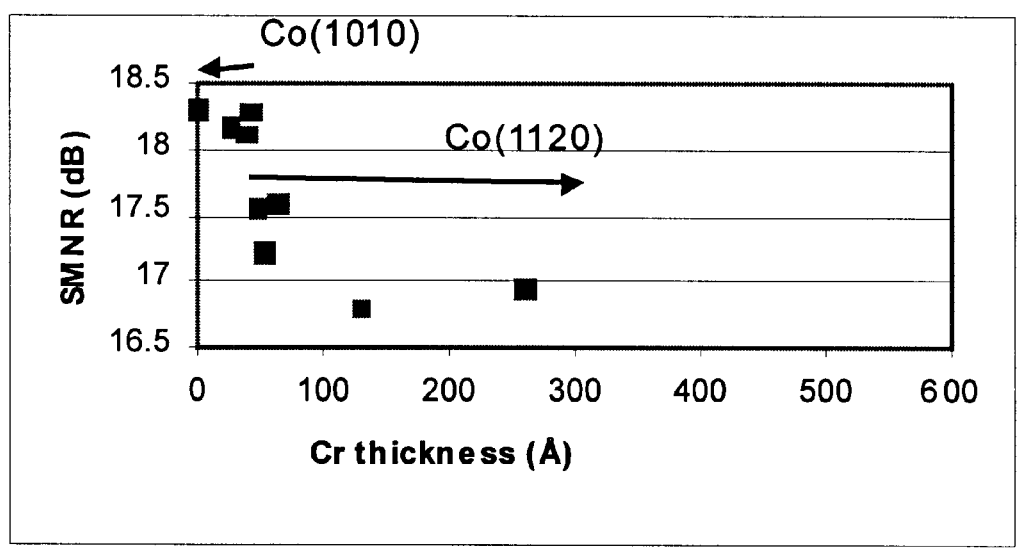
FIG. 1 schematically shows the signal-to-medium noise ratio of magnetic recording media having (10.0) and (11.0) crystallographic orientations.

FIG. 1 shows a comparison of signal-to-medium noise ratio of (10.0) and (11.0) textured media. The film structure is Cr sub-seed layer/NiAl seed layer/CrMo underlayer/$CoCr_{17}Pt_8Ta_2Nb_2$ magnetic layer/carbon on surface-oxidized NiP film on glass-ceramic substrates. X-ray diffraction pattern shows that the media with Cr sub-seed layer thinner and thicker than 30 Å have (10.0) and (11.0) crystallographic orientation respectively. The samples in FIG. 1 were fabricated under identical conditions except the Cr sub-seed layer thickness. FIG. 1 demonstrates that glass media with such film structure and (10.0) orientation have higher SMNR than (11.0) media.

Oxidation of the NiAl seed layer also yields improvements in a variety of recording characteristics vis-à-vis substantially the same media having a NiAl seed layer without an oxidized surface. The NiAl seed layer employed in this invention can contain about 41 to about 55 atomic percent Al, the balance Ni. The crystallographic orientation of Co-alloy magnetic layer is controlled by the underlayer, which may be controlled by the sub-seed layer and seed layer. Suitable underlayer can induce Co(10.0) crystallographic orientation. The combination of NiAl seed layer and Cr-containing underlayer can induce Co(10.0) crystallographic orientation. Variety of other combinations of seed layers and underlayers without NiAl can induce Co(10.0) crystallographic orientations also. However, the exact mechanism by which the (10.0) crystallographic orientation is achieved or the synergistic role of Co, B and Cr in promoting the (10.0) crystallographic orientation in this invention is not known with certainty.

The mechanism by which the presence of B and Cr in the magnetic layer and the (10.0) crystallographic orientation achieves superior recording performance, e.g., higher SMNR, is not known with certainty. It is believed, however, that boron addition into CoCr magnetic alloy enhances Cr segregation into Co-alloy grain boundaries and significantly reduces intergranular exchange coupling of magnetic grains, hence the medium noise is reduced. The effective magneto-crystal anisotropy constant of (11.0) oriented media is lower than that of (10.0) oriented media, hence the medium with (10.0) crystallographic orientation has higher coercivity than that of a medium with (11.0) crystallographic orientation.

In a preferred embodiment, the magnetic layer is Co—Cr—Pt—B. In another embodiment, the Co—Cr—Pt—B comprises at least 15 atomic percent Cr, 5 to 15 atomic percent Pt, 2 to 14 atomic percent B, and Co in the balance.

Other embodiments include (a) a substrate made of glass, glass-ceramic, NiP/aluminum, metal alloys, plastic/polymer material, ceramic, glass-polymer, composite materials or other non-magnetic materials, (b) an underlayer comprising Cr or a Cr-alloy, (c) a seed layer of NiAl or $NiAlO_x$, (d) a sub-seed layer of NiAl or $NiAlO_x$ and (e) a protective overcoat on the magnetic layer. The underlayer is more preferably a CrMo underlayer comprising 5 to 25 atomic percent molybdenum.

In a preferred embodiment, the structure of the recording medium is the following: a glass or glass-ceramic substrate, a $NiAlO_x$ sub-seed layer on the substrate, a NiAl seed layer on the sub-seed layer, a CrMo underlayer on the seed layer, a CoCrPtB magnetic layer on the underlayer and a protective overcoat on the magnetic layer.

In a preferred embodiment, the thickness of the seed layer is about 100 Å to about 2000 Å, the thickness of the underlayer is about 10 Å to about 1000 Å, and the thickness of the magnetic layer is about 100 Å to about 300 Å. In another preferred embodiment, the thickness of the sub-seed layer is about 50 Å to about 1000 Å, the thickness of the seed layer is about 100 Å to about 2000 Å, the thickness of the underlayer is about 10 Å to about 1000 Å, and the thickness of the magnetic layer is about 100 Å to about 300 Å.

In a preferred embodiment, the thickness of the sub-seed layer is 70 Å to about 250 Å, preferably between 75 Å and 150 Å, and most preferably about 100 Å. In a preferred embodiment, the thickness of the seed layer is 200 Å to about 1600 Å, preferably between 300 Å and 1200 Å, and most preferably about 600 Å. In a preferred embodiment, the thickness of the underlayer is 12 Å to about 500 Å, preferably between 15 Å and 250 Å, and most preferably about 25 Å. In a preferred embodiment, the thickness of the magnetic layer is 150 Å to about 250 Å, preferably between 175 Å and 225 Å, and most preferably about 200 Å. In a preferred embodiment, the thickness of the protective layer is 20 Å to about 300 Å, preferably between 30 Å and 100 Å, and most preferably about 50 Å. The protective layer is made of hydrogenated carbon ($CH_x$).

The magnetic recording medium has a remanent coercivity of about 2000 to about 10,000 Oersted, and an Mrt (product of remanance, Mr, and magnetic layer thickness, t) of about 0.2 to about 2.0 memu/cm². In a preferred embodiment, the coercivity is about 2500 to about 9000 Oersted, more preferably in the range of about 3000 to about 6000 Oersted, and most preferably in the range of about 3350 to about 5000 Oersted. In a preferred embodiment, the Mrt is about 0.25 to about 1 memu/cm², more preferably in the range of about 0.3 to about 0.7 memu/cm², and most preferably in the range of about 0.3 to about 0.6 memu/cm².

Embodiments of this invention include sputter depositing a NiAl layer on a glass or glass-ceramic substrate and oxidizing the surface of the sputter deposited NiAl layer at a suitable temperature, e.g., about 100° C. to about 300° C., in an oxidizing atmosphere to form a $NiAlO_x$ sub-seed layer. Suitable oxidizing atmospheres contain about 1 to about 100 volume percent of oxygen ($O_2$), the remainder an inert gas, such as argon (Ar), e.g., about 5 to about 25 volume percent oxygen, such as about 20 percent by volume oxygen. The degree of oxidation can be such that the amount of oxygen in the top 50 Å NiAl layer, after in situ sputter removal of the 40 Å surface layer, is about 15 atomic percent to about 50 atomic percent, such as about 20 atomic percent to about 30 atomic percent.

In the oxidation technique disclosed by Doemer et al. in U.S. Pat. No. 5,302,434, the NiP film is oxidized such that the nickel is oxidized. However, in accordance with this invention, it was found that Al of NiAl is oxidized without any substantial oxidation of Ni. In embodiments of this invention, the oxidized surface of the $NiAlO_x$ sub-seed layer contains substantially elemental Ni, while Al is present in the form of about 75 atomic percent oxide and about 25 atomic percent substantially elemental Al, to a depth of about 50 Å from the surface. Even at greater depths from the surface, such as about 160 Å, the aluminum oxide/aluminum metal ratio is about 0.45. However, Ni is predominately present substantially in its elemental form throughout the entire film.

Embodiments of this invention include deposition of a NiAl seed layer on the $NiAlO_x$ sub-seed layer and subsequent deposition of an underlayer, such as Cr or a Cr-alloy underlayer, e.g., CrMo, on the NiAl seed layer. An embodiment of this invention also includes depositing a magnetic layer on the NiAl seed layer. Another embodiment of this invention includes depositing a thin intermediate magnetic layer on the underlayer and depositing the magnetic layer on the intermediate layer. The intermediate layer comprises a CoCrTa layer, which can comprise about 10 to about 40 atomic percent Cr and about 0 to about 6 atomic percent Ta. Embodiments of this invention include the use of any of the various magnetic alloys containing B, Cr and Co, such as CoCrB, CoCrPtB, CoCrNiB, CoCrNiPtB, CoCrNiTaB, CoCrNiNbB, CoCrPtTaB, CoCrPtNbB and CoCrPtTaNbB, and other combinations of B, Cr, Co, Pt, Ni, Ta and Nb, in the magnetic layer.

Figure 2:
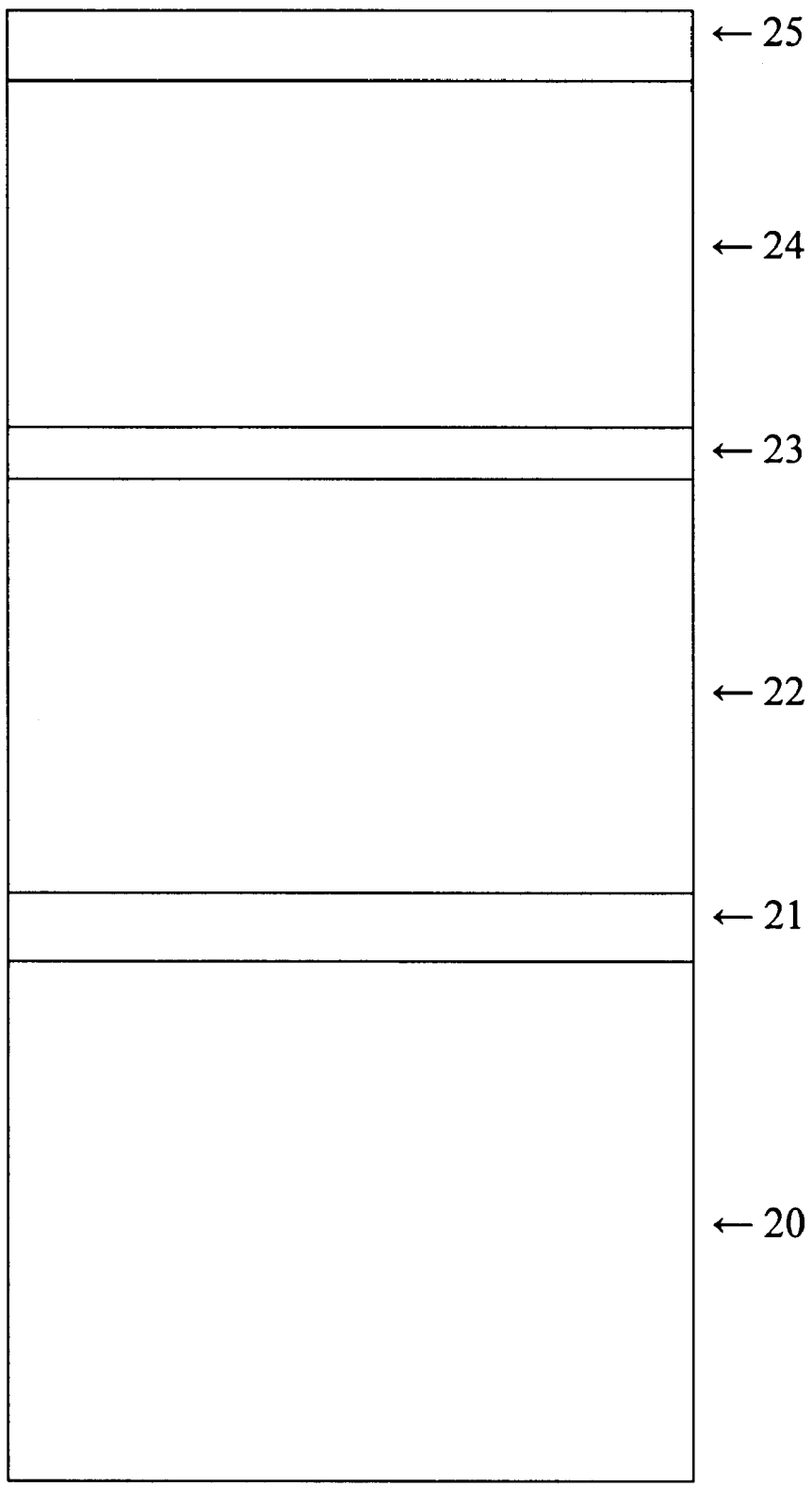
FIG. 2 schematically shows the film structure of a magnetic recording medium in accordance with an embodiment of this invention.

An embodiment of the present invention is schematically illustrated in FIG. 2 for illustrative purposes. Other embodiments of this invention include additional or fewer layers than those shown in FIG. 2 and different layer stacking sequences than that shown in FIG. 2. Even thought FIG. 2 shows sequential layers on one side of the substrate 20, this invention comprises sputter depositing sequentially layers on both sides of the substrate.

Adverting to FIG. 2, a NiAl layer is deposited on substrate 20, e.g., a glass or glass-ceramic substrate. The surface of the NiAl layer is surface oxidized, as by exposure to an oxidizing environment, into a $NiAlO_x$ sub-seed layer 21 of FIG. 2. Subsequently, a NiAl seed layer 22 is deposited on the $NiAlO_x$ sub-seed layer 21. Then, an underlayer, such as CrMo, is sputter deposited on the NiAl seed layer 22. An optional intermediate or flash layer of CoCrTa (not shown in FIG. 2 for illustrative convenience) is then sputter deposited on underlayer 23. The use of an intermediate is disclosed in co-pending U.S. patent application Ser. No. 09/152,326 filed on Sep. 14, 1998 now U.S. Pat. No. 6,117,570, co-pending U.S. application Ser. No. 09/188,681, filed on Nov. 10, 1998 now U.S. Pat. No. 6,150,016, co-pending U.S. application Ser. No. 09/188,715 filed on Nov. 10, 1998 now U.S. Pat. No. 6,221,481 and co-pending U.S. application Ser. No. 09/188,682, filed on Nov. 10, 1998. now U.S. Pat. No. 6,242,086, the entire disclosures of which are hereby incorporated herein by reference. The use of an intermediate CoCrTa layer increases the coercivity of the magnetic films.

Magnetic layer 24 is then sputter deposited on the CoMo underlayer or on the optional intermediate CoCrTa layer. A protective covering overcoat 25 is then sputter deposited on the magnetic layer 24. As in conventional practices, a lubricant topcoat (not shown in FIG. 2 for illustrative convenience) is deposited on the protective covering overcoat 25.

Figure 3:
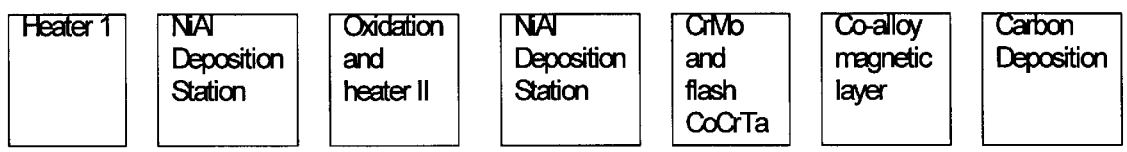
FIG. 3 schematically illustrates a sputtering system for use in implementing embodiments of this invention.

An apparatus for manufacturing magnetic recording media in accordance with the embodiments of the present invention is schematically illustrated in FIG. 3. The disk substrates travel sequentially from heater I to a NiAl deposition station and then to the oxidation and heater station II. As a result, the $NiAlO_x$ sub-seed layer is formed on the disk substrates. Then, the disk substrates travel to a NiAl station for deposition of the NiAl seed layer. Subsequent to the deposition of the sub-seed layer and the seed layer, the disk substrates are passed through the CrMo underlayer deposition station wherein the CrMo underlayer is deposited. Optionally the disk substrates are passed through the flash CoCrTa layer deposition station wherein optional CoCrTa flash layer is deposited, typically at thickness of about 1.5 to about 150 Å, e.g., about 5 to about 30 Å. The disks are then passed to the magnetic layer deposition station and then to the protective carbon overcoat deposition station.

EXAMPLES

All samples described in this disclosure were fabricated with DC magnetron sputtering except carbon films were made with AC magnetron sputtering.

Figure 4:
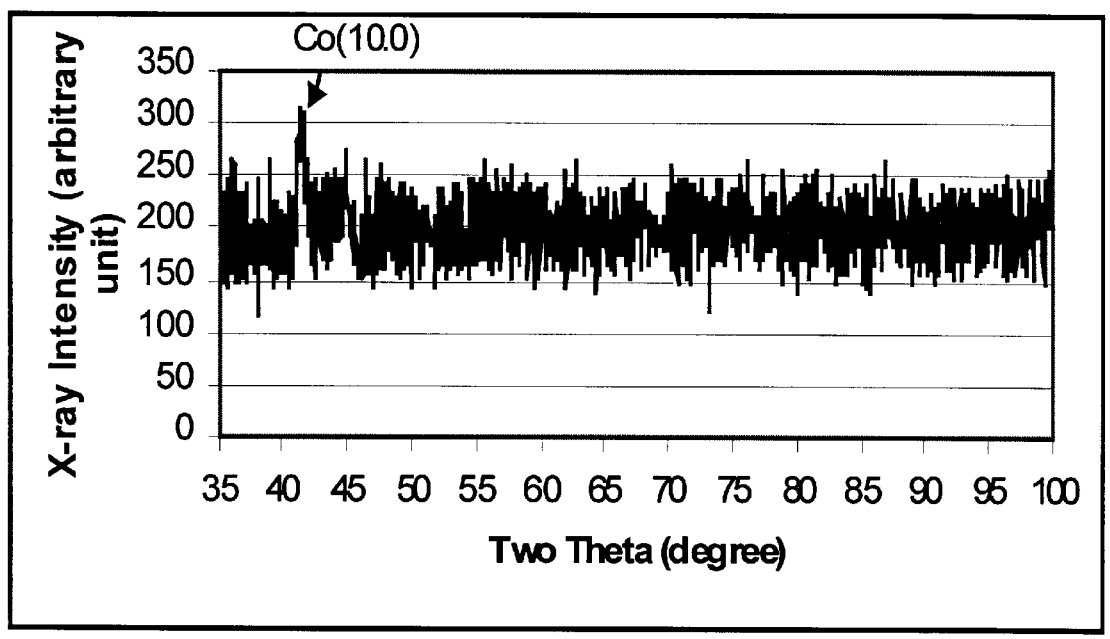
FIG. 4 shows that the magnetic recording medium according to this invention has a (10.0) crystallographic orientation.
Figure 5:
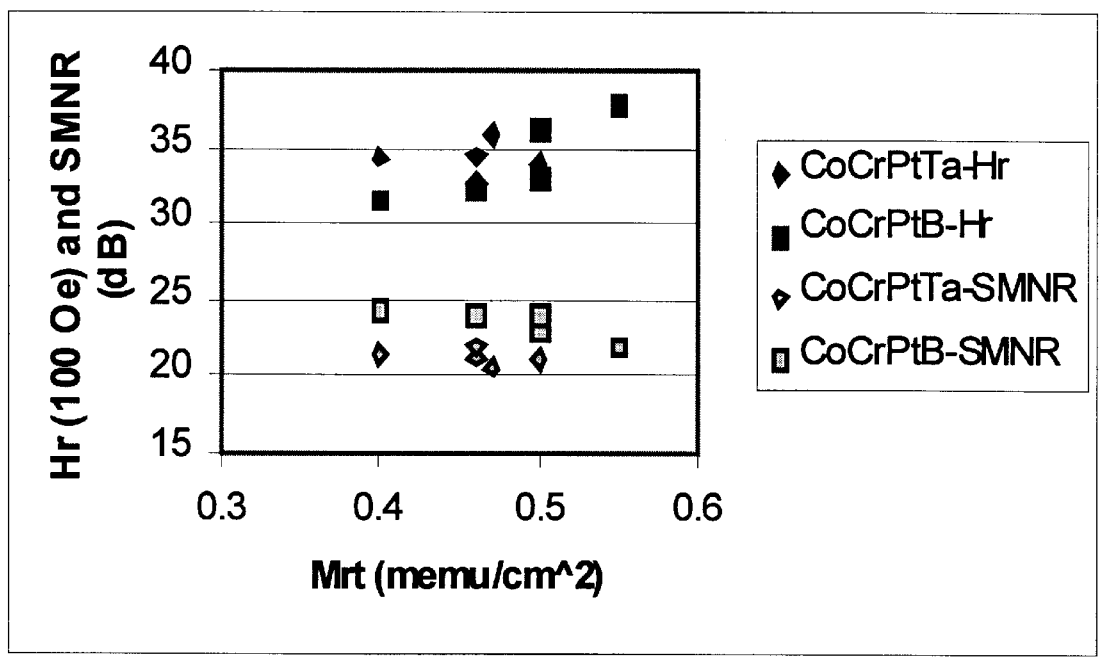
FIG. 5 compares the remanent coercivity and signal-to-medium noise ratio of a magnetic recording medium according to an embodiment of this invention with a magnetic recording medium having a CoCrPtTa recording layer.

Magnetic recording media in accordance with embodiments of this invention comprising a magnetic layer comprising Cr, B and Co, wherein the magnetic layer has a substantially (10.0) crystallographic orientation, exhibit a variety of improved recording characteristics. Such improved characteristics are shown in FIG. 5. FIG. 4 demonstrates that the medium according to this invention has (10.0) crystallographic orientation. The sample shown in FIG. 4 has identical film structure as that shown in FIG. 2 except that the CrMo thickness is 80 Å, that is, 100 Å NiAlO$_x$/600 Å NiAl/CrMo/CoCrPtB/50 Å a-CH$_x$. The composition of the sample of FIG. 4 in atomic percent is Ni$_{50}$Al$_{50}$, Cr$_{90}$Mo$_{10}$, and Co$_{70}$Cr$_{18}$Pt$_6$B$_6$, respectively. The thickness of the magnetic layer of the sample in FIG. 4 is 290 Å.

CoCrPtTa and CoCrPtTaNb media are commonly used in the industry for high-density magnetic recording. FIG. 5 compares Hr and SMNR recording characteristics of magnetic recording media having CoCrPtTa and CoCrPtB as the recording layer alloys. In particular, FIG. 5 shows the SMNR of the glass media according to this invention, i.e., CoCrPtB discs, and the media with similar film configuration, but utilizing Co$_{71}$Cr$_{17}$Pt$_8$Ta$_4$ in the recording layer. The CrMo underlayer thickness was adjusted for obtaining proposed coercivity. In particular, since the film coercivity is affected by the CrMo thickness, the CrMo thickness in the samples of FIG. 5 was adjusted to make the coercivity in the designated range shown on FIG. 5.

The (10.0) textured CoCrPtB media in the coercivity range shown in FIG. 5 have much higher SMNR measured at 270 kfci than CoCrPtTa media regardless of whether the coercivity of CoCrPtB media of FIG. 5 was higher or lower coercivity than that of CoCrPtTa media. In short, SMNR of CoCrPtB media are higher than that of CoCrPtTa media with similar Mrt.

The data of FIG. 5 are shown in Table 1.

alloy of the magnetic layer and the thickness of the CrMo layer. The two kinds of samples in Table 2 were fabricated under identical condition otherwise. The target powers used for the deposition of magnetic films were adjusted for similar Mrt of the two kinds of media. The CrMo underlayer thickness was adjusted for similar coercivity of the two kinds of media. In Table 2, Hr and Mrt was measured with a rotating disc magnetometer (RDM), and the recording performances were measured with a Guzik read-write analyzer and a giant magnetoresistive (GMR) head. The SMNR was measured at 360 kfci (thousands of flux change per inch). MFA stands for signal output at middle frequency. PW50 stands for signal width at half maximum. Table 2 demonstrates that the media according to this invention have much higher SMNR and lower transition jitter than those of media having CoCrPtTaNb.

TABLE 2

| Alloy | power for magnetic layer (kW) | Hr (Oe) | Mrt (memu/cm²) | MFA (μVpp) | SMNR (dB) | Jitter (μ") | PW50 (μ") | CrMo (Å) |
|---|---|---|---|---|---|---|---|---|
| CoCrPtTaNb | 6.6 | 3331 | 0.41 | 413 | 18.6 | 0.149 | 7.9 | 80 |
| CoCrPtB | 5.2 | 3465 | 0.46 | 430 | 20.3 | 0.116 | 7.9 | 40 |

Table 3 compares the remanent coercivity of Al discs with a 530 Å NiAl/25 Å CrMo/CoCrPtB structure according to this invention and a comparison example having 200 Å CrMo/CoCrPtB structure. The coercivity was measured with RDM. The coercivity of media of this invention is much higher than that of the comparison example.

TABLE 3

| Structure | Hr (Oe) | Mrt (memu/cm²) |
|---|---|---|
| NiAl/CrMo/CoCrPtB | 3331 | 0.63 |
| CrMo/CoCrPtB | 2677 | 0.55 |

TABLE 1

| Mrt (memu/cm2) | Hr-CoCrPtTa (Oe) | Hr-CoCrPtB (Oe) | SMNR-CoCrPtTa (dB) | SMNR-CoCrPtB (dB) |
|---|---|---|---|---|
| 0.4 | 3431 | | 21.4 | |
| 0.4 | | 3153 | | 24.37 |
| 0.46 | 3438 | | 21.2 | |
| 0.46 | 3268 | | 21.9 | |
| 0.46 | | 3220 | | 24.12 |
| 0.47 | 3580 | | 20.5 | |
| 0.5 | 3357 | | 21 | |
| 0.5 | | 3293 | | 24.07 |
| 0.5 | | 3635 | | 23.02 |
| 0.55 | | 3774 | | 21.99 |

Table 2 shows a side-by-side comparison of media having Co$_{71}$Cr$_{17}$Pt$_8$Ta$_2$Nb$_2$ and Co$_{70}$Cr$_{18}$Pt$_6$B$_6$ as the magnetic layer alloy. The compared media were essentially the same in all respect as the recording medium of FIG. 2 and produced by essentially the same techniques, except for the The superior magnetic properties of the media according to this invention are partially due to the small and uniform grains of the magnetic films as shown with Table 4. Table 4 lists the grain size of three kinds of media from TEM (transition electron microscopy) plane view.

TABLE 4

| Magnetic alloy | CoCr$_{17}$Pt$_8$Ta$_2$Nb$_2$ | CoCr$_{17}$Pt$_8$Ta$_2$Nb$_2$ | CoCr$_{18}$Pt$_6$B$_6$ |
|---|---|---|---|
| Substrate | Al | Glass-ceramic | Glass-ceramic |
| Seed layer/underlayer | NiAl/CrMo | NiAlOx/NiAl/CrMo | NiAlOx/NiAl/CrMo |
| Mean, x (nm) | 15 | 12 | 11 |
| Standard deviation, δ | 5 | 4 | 3 |
| Minimum | 6.00 | 4.48 | 4.15 |
| Maximum | 32.00 | 31.05 | 42.93 |
| Uniformity, δ/X | 0.3 | 0.3 | 0.27 |
| Grains counted | 675 | 618 | 963 |
| Hr(Oe) | 3000 | 3000 | 3600 |
| Mrt (memu/cm^2) | 0.4 | 0.5 | 0.5 |

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

What is claimed is:

1. A magnetic recording medium comprising:

a substrate, a seedlayer comprising NiAl, an underlayer comprising CrMo and a magnetic layer comprising B, Cr and Co on the underlayer, wherein the magnetic layer has a substantially (10.0) crystallographic orientation and the underlayer is directly below the magnetic layer.

2. The magnetic recording medium of claim 1, wherein the magnetic layer comprises Co—Cr—Pt—B.

3. The magnetic recording medium of claim 2, wherein the Co—Cr—Pt—B comprises at least 15 atomic percent Cr, 5 to 15 atomic percent Pt, 2 to 14 atomic percent B, and Co in balance.

4. The magnetic recording medium of claim 1, wherein the underlayer comprising CrMo comprises 5 to 25 atomic percent Mo.

5. The magnetic recording medium of claim 1, further comprising a sub-seed layer between the substrate and the seed layer, wherein the seed layer comprises NiAl and the sub-seed layer comprises NiAlO$_x$.

6. The magnetic recording medium of claim 1, wherein the thickness of the seed layer is about 100 Å to about 2000 Å, the thickness of the underlayer is about 10 Å to about 1000 Å, and the thickness of the magnetic layer is about 100 Å to about 500 Å.

7. The magnetic recording medium of claim 1, wherein the compositions in atomic percent of the seed layer, the underlayer and the magnetic layer are Ni$_{50}$Al$_{50}$, Cr$_{90}$Mo$_{10}$ and Co$_{70}$Cr$_{18}$Pt$_6$B$_6$, respectively.

8. The magnetic recording medium of claim 1, which has a remanent coercivity of about 2000 to about 10,000 Oersted, and an Mrt of about 0.2 to about 2.0 memu/cm$^2$.

9. A method of manufacturing a magnetic recording medium, comprising:

depositing a seed layer comprising NiAl on a substrate;

depositing an underlayer comprising CrMo on the seed layer; and depositing a magnetic layer directly on the underlayer, wherein the magnetic layer comprises B, Cr and Co and the magnetic layer has a substantially (10.0) crystallographic orientation.

10. The method according to claim 9, wherein the magnetic layer comprises Co—Cr—Pt—B.

11. The method according to claim 10, wherein the Co—Cr—Pt—B comprises at least 15 atomic percent Cr, 5 to 15 atomic percent Pt, 2 to 14 atomic percent B, and Co in balance.

12. The method according to claim 9, wherein the underlayer comprises CrMo comprising 5 to 25 atomic percent Mo.

13. The method according to claim 9, wherein the thickness of the seed layer is about 100 Å to about 2000 Å, the thickness of the underlayer is about 10 Å to about 1000 Å, and the thickness of the magnetic layer is about 100 Å to about 300 Å.

14. The method according to claim 9, wherein the compositions in atomic percent of the seed layer, the underlayer and the magnetic layer are Ni$_{50}$Al$_{50}$, Cr$_{90}$Mo$_{10}$ and Co$_{70}$Cr$_{18}$Pt$_6$B$_6$, respectively.

15. The method according to claim 9, further comprising depositing a NiAlO$_x$ sub-seed layer between the substrate and the seed layer.

* * * * *